(12) United States Patent
Liu et al.

(10) Patent No.: US 12,127,375 B2
(45) Date of Patent: Oct. 22, 2024

(54) PUMP DRIVE DEVICE

(71) Applicant: BEEHE ( TAICANG ) ELECTRIC CO., LTD., Suzhou (CN)

(72) Inventors: Ronghua Liu, Suzhou (CN); Ping Chen, Suzhou (CN); Jiechuang Zhou, Suzhou (CN)

(73) Assignee: BEEHE ( TAICANG ) ELECTRIC CO., LTD., Suzhou (CN)

( * ) Notice: Subject to any disclaimer, the term of this patent is extended or adjusted under 35 U.S.C. 154(b) by 364 days.

(21) Appl. No.: 17/498,769

(22) Filed: Oct. 12, 2021

(65) Prior Publication Data

US 2022/0053662 A1 Feb. 17, 2022

Related U.S. Application Data

(63) Continuation of application No. PCT/CN2020/109189, filed on Aug. 14, 2020.

(51) Int. Cl.
*H05K 7/20* (2006.01)
*F04D 13/08* (2006.01)
(Continued)

(52) U.S. Cl.
CPC ......... *H05K 7/20281* (2013.01); *F04D 13/08* (2013.01); *F04D 13/086* (2013.01);
(Continued)

(58) Field of Classification Search
CPC .... F04D 15/0218; F04D 13/086; F04D 13/08; F04D 13/16; F04D 13/12; F04D 29/4293;
(Continued)

(56) References Cited

U.S. PATENT DOCUMENTS

| 6,059,208 A * | 5/2000 | Struthers ................... E03F 5/26 |
| | | 241/46.01 |
| 2018/0372122 A1* | 12/2018 | Wang .................... F04D 29/247 |
| 2019/0159359 A1 | 5/2019 | Tung et al. |

FOREIGN PATENT DOCUMENTS

| CN | 201444279 U | 4/2010 |
| CN | 107295779 A | 10/2017 |

(Continued)

*Primary Examiner* — Peter J Bertheaud
(74) *Attorney, Agent, or Firm* — Bayramoglu Law Offices LLC

(57) ABSTRACT

A pump drive device includes a box body and at least one drive pump. A liquid-phase zone module is arranged in the box body, and the drive pump is arranged in the liquid-phase zone module. A pump drive device liquid inlet, a pump drive device liquid outlet, a liquid supply port, and an exhaust port are arranged on the box body and are located outside the liquid-phase zone module. The drive pump is connected to the pump drive device liquid outlet through a delivery pipe. The pump drive device has a simple structure and a reasonable design. The pump drive device integrates driving, pressure stabilization, exhaust, cavitation prevention, liquid-level monitoring and warning, pressure monitoring and warning, temperature monitoring and warning, medium purification, and other functions, which achieves an integration, miniaturization, and lightweight design, well matches the application of liquid cooling system products in various industries.

20 Claims, 5 Drawing Sheets

(51) Int. Cl.
   *F04D 13/12*   (2006.01)
   *F04D 13/16*   (2006.01)
   *F04D 15/02*   (2006.01)
   *F04D 29/40*   (2006.01)
   *F04D 29/42*   (2006.01)
   *F04D 29/60*   (2006.01)
   *F04D 29/70*   (2006.01)
(52) U.S. Cl.
   CPC ............. *F04D 13/12* (2013.01); *F04D 13/16* (2013.01); *F04D 15/0218* (2013.01); *F04D 29/406* (2013.01); *F04D 29/426* (2013.01); *F04D 29/4293* (2013.01); *F04D 29/606* (2013.01); *F04D 29/708* (2013.01); *H05K 7/20236* (2013.01); *H05K 7/203* (2013.01); *H05K 7/20318* (2013.01); *H05K 7/20327* (2013.01); *H05K 7/20372* (2013.01)
(58) Field of Classification Search
   CPC .... F04D 29/406; F04D 29/426; F04D 29/606; F04D 29/708; H05K 7/203; H05K 7/20236; H05K 7/20281; H05K 7/20318; H05K 7/20327; H05K 7/20372
   See application file for complete search history.

(56) References Cited

FOREIGN PATENT DOCUMENTS

| CN | 109195424 A | 1/2019 |
| CN | 208540360 U | 2/2019 |
| CN | 109831896 A | 5/2019 |

* cited by examiner

PUMP DRIVE DEVICE

CROSS REFERENCE TO THE RELATED APPLICATIONS

This application is the continuation application of International Application No. PCT/CN2020/109189, filed on Aug. 14, 2020, the entire contents of which are incorporated herein by reference.

TECHNICAL FIELD

The present invention belongs to the technical field of cooling of electronic components, and particularly relates to a pump drive device.

BACKGROUND

With the development of electrical device packaging, wafer processing, and photolithography, the power density of electronic devices continues to increase, resulting in continuous increase of the heat flow density of the devices. The traditional air-cooling method cannot meet the cooling requirements or application scenario requirements. Due to the advantages of high cooling efficiency, low noise, high reliability, and energy conservation, the liquid cooling system will eventually replace the air-cooling system.

In the power electronics industry, heating components allowed to be cooled by the liquid-cooling technology include, but are not limited to, 1) nacelles, current transformers, generators, and the like in the fields of new energy such as wind power and photovoltaics; 2) frequency converters, power units, charging piles, and the like in the field of industrial variable frequency drives (VFDs); and 3) thyristor valves, insulated gate bipolar transistor (IGBT) valves, circuit breakers, reactive power compensators, and the like in the direct current (DC) transmission and distribution industry. The liquid-cooling technology was first applied to the power electronics industry in 1878, and the current application thereof is more prone to integrated and high-density design.

In the ICT industry, with the rapid iterative development of ICT products, the heat dissipation of central processing unit (CPU), graphics processing unit (GPU), baseband unit (BBU), dual in-line memory module (DIMM), and the like has become increasingly important. The cooling technology for data centers is changing from room-level cooling gradually to in-row cooling, rack-level cooling, and server-level cooling, and the liquid-cooling technology is gradually replacing the air-cooling technology.

In the rail transit industry, the application of the liquid-cooling technology has been basically realized in the cooling for component products such as frequency converters, rectifiers, and new energy battery packs.

In the medical device industry, there are also mature liquid-cooling technology applications in high-power precision medical devices such as imaging medical products, which have irreplaceable advantages and characteristics.

Therefore, single-phase liquid cooling systems and phase-change liquid cooling systems have become research and development hotspots in the ICT industry, power electronics industry, rail transit industry, and medical device industry.

1) Single-Phase Liquid-Cooling

A submerged pump drive device is used to drive a cooling medium into a liquid distributor, and then the cooling medium is evenly distributed to various heating components through the liquid distributor to take away the heat of the heating components.

2) Phase-Change Liquid-Cooling

A submerged pump drive device is used to drive a cooling medium into a liquid distributor, and then the cooling medium is evenly distributed to various heating components through the liquid distributor, where the cooling medium absorbs the heat of the heating components and partly undergoes a phase change to form a gas-liquid two-phase flow; the two-phase flow cooling medium enters a condenser, where the heat carried by the cooling medium is dissipated to the environment through a condensation process of the condenser and the cooling medium is condensed into a liquid state; and the liquid-state cooling medium is returned to the submerged pump drive device, thereby forming a closed loop. The condenser includes a plate heat exchanger, an air-cooled radiator, and the like.

However, due to the limitations of component design features, the conventional pump drive device in the prior liquid cooling system cannot achieve a compact design, which makes a liquid cooling system have a large volume, a high load, and a high manufacturing cost and unable to meet the requirements of compact products.

SUMMARY

Objective of the Present Invention

In order to overcome the above shortcomings, the present invention provides a pump drive device. The pump drive device of the present invention integrates driving, pressure stabilization, exhaust, cavitation prevention, liquid-level monitoring and warning, pressure monitoring and warning, temperature monitoring and warning, medium purification, and other functions, which achieves an integration, miniaturization, and lightweight design, well matches the application of liquid cooling system products in various industries, reduces a manufacturing cost of the liquid cooling system, saves an installation space, and improves the efficiency and accuracy of operation and maintenance.

Technical Solution

In order to achieve the above objective, the present invention provides a pump drive device, including a box body and at least one drive pump. A liquid-phase zone module is arranged in the box body, and the drive pump is arranged in the liquid-phase zone module. A pump drive device liquid inlet, a pump drive device liquid outlet, a liquid supply port, and an exhaust port are arranged on the box body and are located outside the liquid-phase zone module. The drive pump is connected to the pump drive device liquid outlet through a delivery pipe.

A gas-phase zone module is further arranged in the box body. The gas-phase zone module is arranged above the liquid-phase zone module, and the gas-phase zone module is provided with at least one interface and air supply valve.

In addition, the pump drive device further includes a medium purification module assembly. The medium purification module assembly is arranged between the pump drive device liquid inlet and the pump drive device liquid outlet. The medium purification module assembly is provided to realize the real-time filtration and purification of a cooling medium, thereby ensuring the stability of a quality of the cooling medium and suppressing the risks of material corrosion, microbial growth, and precipitation and accumulation of organic impurities at a heat absorption end which may be caused by a liquid cooling system.

A tank for storing the medium is arranged in the medium purification module assembly, and the tank is provided with a medium for removing anions, cations, organic matters, colloids, peculiar smell, residual chlorine and other impurities in water. The medium is a mixed bed resin and a porous adsorption medium.

Further, the pump drive device liquid inlet is connected to the box body through a liquid inlet pipe. A liquid return temperature transmitter and a liquid return pressure transmitter are arranged on the liquid inlet pipe, and the liquid return temperature transmitter and the liquid return pressure transmitter are connected to a control device.

Furthermore, the pump drive device liquid outlet is connected to the box body through a liquid outlet pipe. A liquid supply temperature transmitter and a liquid supply pressure transmitter are arranged directly above the liquid outlet pipe, and the liquid supply temperature transmitter and the liquid supply pressure transmitter are connected to the control device. In this way, a temperature, a temperature change, and a pressure of the cooling medium are monitored, and an abnormal temperature of the cooling medium is warned.

Preferably, the box body is provided with a liquid-level switch and a liquid-level meter, and the liquid-level switch and the liquid-level meter are connected to the control device.

When a liquid level in a liquid-phase zone of a submerged pump drive device is excessively low, a warning signal is automatically sent out.

Preferably, a check valve or a one-way valve is arranged inside or outside the drive pump, which avoids the formation of a water hammer to cause damage to the liquid cooling system, and prevents the cooling medium from flowing backward, or returning to an inlet of a working pump through a reserve pump to cause a short circuit.

Further, the pump drive device liquid inlet or the pump drive device liquid outlet is provided with a filter assembly. The filter assembly is provided to filter the cooling medium, thereby ensuring the purity of the cooling medium, preventing impurities in the cooling medium from damaging a to-be-cooled device, and providing sufficient protection for the pump drive module and the to-be-cooled device.

The filter assembly is provided with a housing and a filter cartridge. The filter cartridge is arranged inside the housing, and the housing is welded and fixed to the pump drive device liquid inlet or the pump drive device liquid outlet. A condensation system for the pump drive device of the present invention is provided. Specifically, the pump drive device liquid outlet of the box body is connected to an inlet of a condenser through a pipe, and a hot-side outlet of the condenser is connected to an inlet end of the filter assembly through a pipe.

An outlet end of the filter assembly is connected to a liquid supply port of a heating component through a pipe, and a liquid return port of the heating component is connected to the pump drive device liquid inlet through a pipe.

It can be seen from the above technical solutions that the present invention has the following advantages:

1. The pump drive device of the present invention integrates driving, pressure stabilization, exhaust, cavitation prevention, liquid-level monitoring and warning, pressure monitoring and warning, temperature monitoring and warning, medium purification, and other functions, which achieves an integration, miniaturization, and lightweight design, well matches the application of liquid cooling system products in various industries, reduces a manufacturing cost of the liquid cooling system, saves an installation space, and improves the efficiency and accuracy of operation and maintenance.

2. The pump drive device of the present invention integrates drive pumps and degassing and buffer modules, which not only provides the driving and circulation power for a liquid cooling system, but also realizes the pressure stabilization of the system, the static pressure supply for the initial operation of the system, the removal of gas in a cooling medium, and other functions. The integrated submerged pump drive device has a standard interface, such that the pump drive device can be well connected with other components of a liquid cooling system, thereby meeting the requirements of different types of products.

3. The pump drive device of the present invention can be used in compact products in the ICT industry, power electronics industry, rail transit industry, and medical device industry where the conventional liquid cooling system cannot be used, which greatly saves installation space, reduces installation difficulty, and meets facilities requirements.

4. The pump drive device of the present invention can easily realize the integrated design with a to-be-cooled product.

DETAILED DESCRIPTION OF THE EMBODIMENTS

Figure 1A:
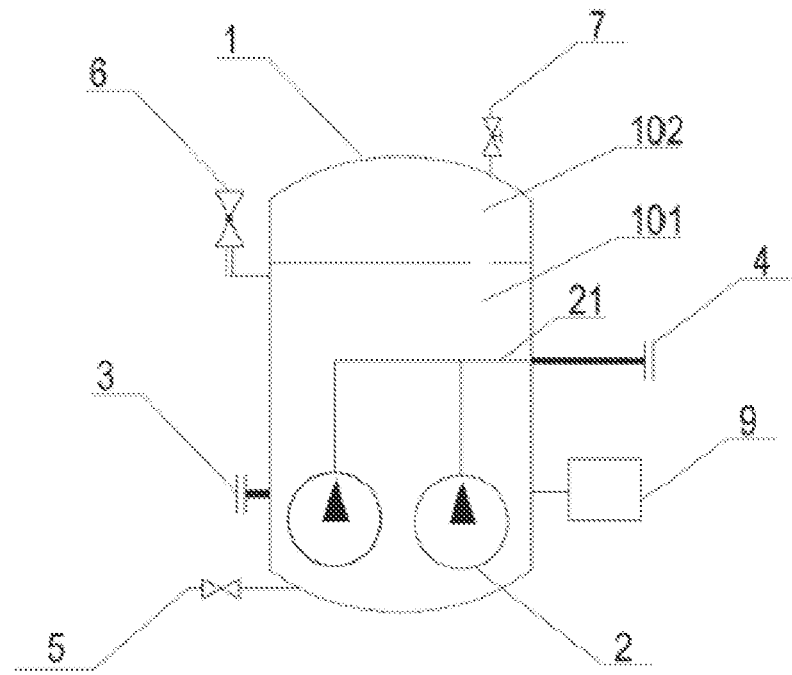
FIG. 1A is a working principle diagram of a pump drive device provided with a check valve inside a pump according to the present invention.
Figure 1B:
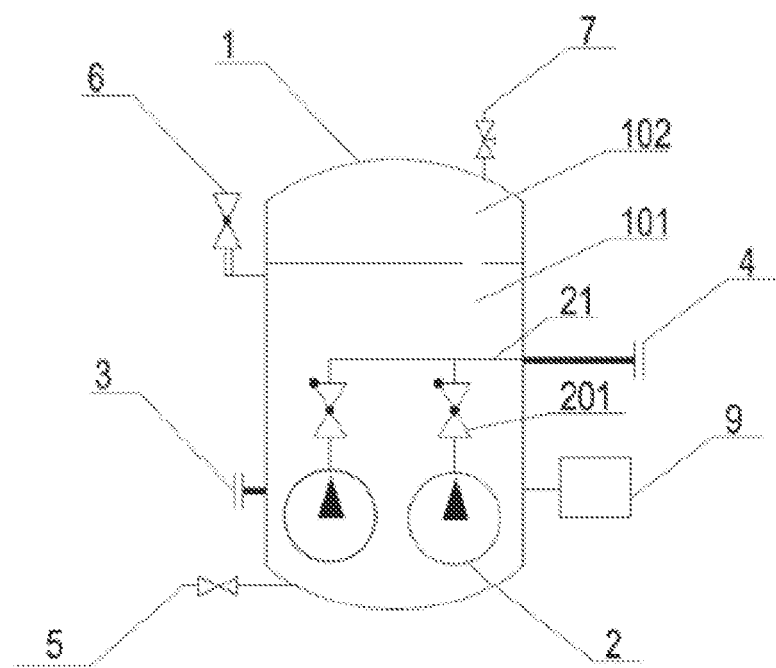
FIG. 1B is a working principle diagram of a pump drive device provided with a check valve outside a pump according to the present invention.
Figure 2:
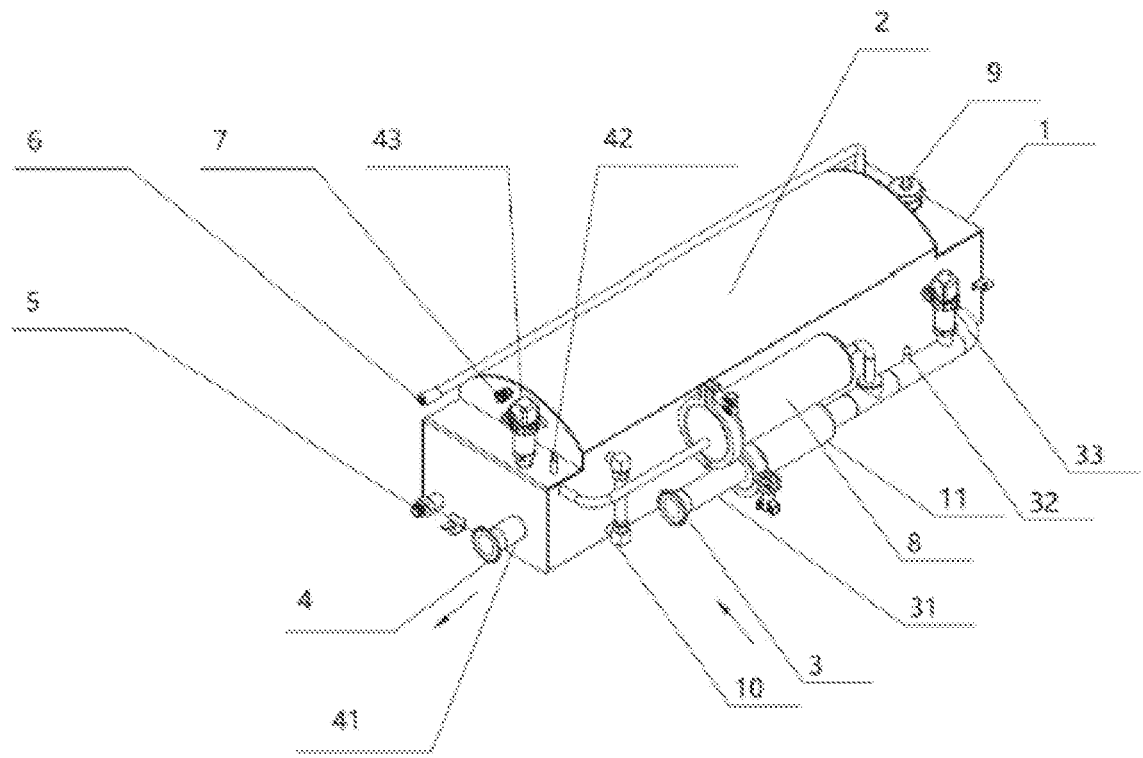
FIG. 2 is a structural diagram of a horizontal submerged pump drive device according to the present invention.
Figure 3:
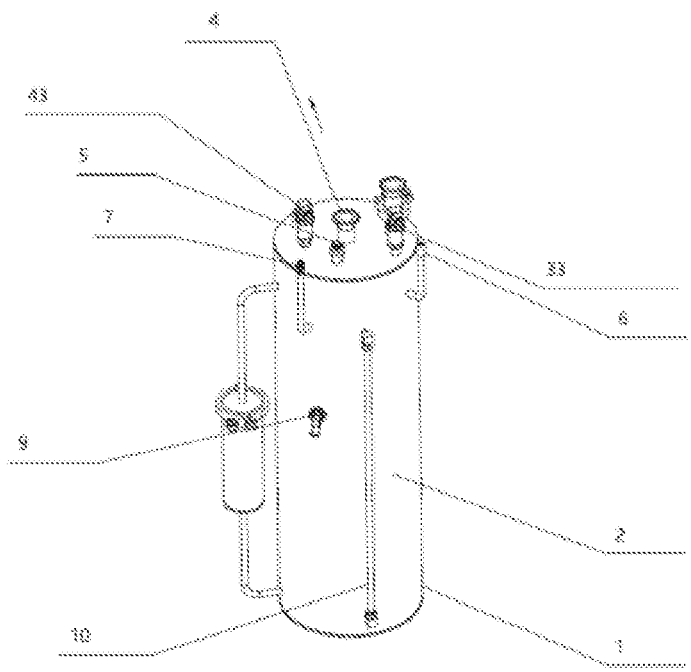
FIG. 3 is a structural diagram of a vertical submerged pump drive device according to the present invention.
Figure 4:
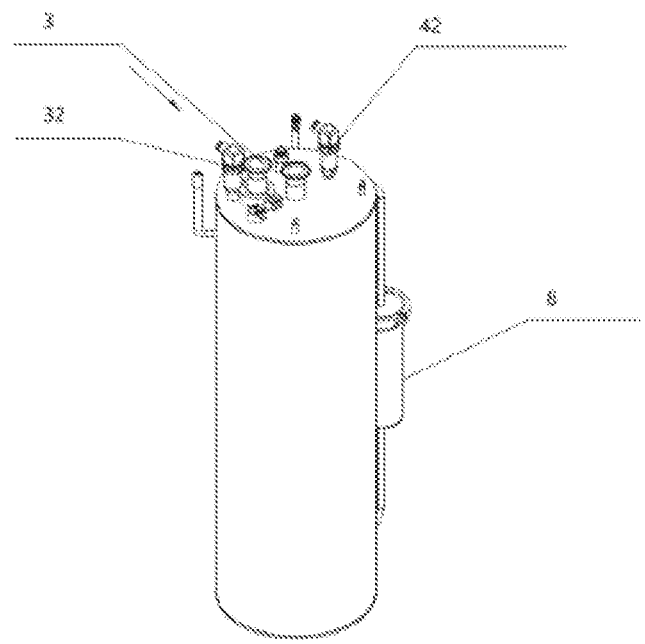
FIG. 4 is a structural diagram of the vertical submerged pump drive device according to the present invention at another angle.

The present invention is further illustrated below with reference to the drawings and specific embodiments.

EMBODIMENTS

The embodiments of the present invention are described below in detail. Examples of the embodiments are shown in the drawings. The same or similar numerals represent the same or similar elements or the elements having the same or similar functions throughout the specification. The embodiments described below with reference to the drawings are exemplary, are used only for explaining the present invention, and should not be construed as a limitation to the present invention.

In the description of the present invention, it should be understood that the terms "central", "longitudinal", "transverse", "length", "width", "thickness", "upper", "lower", "front", "back", "left", "right", "vertical", "horizontal", "top", "bottom", "inner", "clockwise", "anticlockwise", and the like are used to indicate orientations or position relationships shown in the drawings, and these terms are merely intended to facilitate the description of the present invention or simplify the description, rather than to indicate or imply that the mentioned apparatus or elements must have the specific orientation or be constructed and operated in the specific orientation. Therefore, these terms should not be construed as a limitation to the present invention.

Moreover, the terms such as "first" and "second" are used only for the purpose of description and cannot be understood as indicating or implying relative importance or implicitly indicating the number of technical features denoted. Thus, features defined with "first" and "second" may explicitly or implicitly include one or more of the features. In the description of the present invention, unless otherwise specifically defined, "a plurality of" means two or more.

In the present invention, unless otherwise clearly specified and limited, the terms "mount", "connected with", "connected to", and "fixed" should be understood in a broad sense. For example, the connection may be a fixed connection, a detachable connection or an integrated connection; it may be a mechanical connection or an electrical connection; it may be a direct connection or an indirect connection through an intermediate medium; or it may be communication between the interiors of two components. Those skilled in the art may understand specific meanings of the above terms in the present invention based on a specific situation.

In the present invention, unless otherwise expressly specified and defined, that a first feature is "above" or "under" a second feature may include that the first feature is in direct contact with the second feature, or that the first feature and the second feature are not in direct contact with each other but are in contact through another feature between them. In addition, that the first feature is "over", "above", and "on" the second feature includes that the first feature is directly above and diagonally above the second feature, or simply indicates that a horizontal height of the first feature is larger than that of the second feature. That the first feature is "beneath", "below", and "under" the second feature includes that the first feature is directly below and diagonally below the second feature, or simply indicates that a horizontal height of the first feature is smaller than that of the second feature.

Embodiment 1

A pump drive device is provided in this embodiment, including the box body 1 and at least one drive pump 2. The liquid-phase zone module 101 is arranged in the box body 1, and the drive pump 2 is arranged in the liquid-phase zone module 101. The pump drive device liquid inlet 3, the pump drive device liquid outlet 4, the liquid supply port 5, and the exhaust port 6 are arranged on the box body 1 and are located outside the liquid-phase zone module 101. The drive pump 2 is connected to the pump drive device liquid outlet 4 through the high-pressure delivery pipe or the high-pressure chamber 21.

Embodiment 2

A pump drive device is provided in this embodiment, including the box body 1 and at least one drive pump 2. The liquid-phase zone module 101 and the gas-phase zone module 102 are arranged in the box body 1. The drive pump 2 is arranged in the liquid-phase zone module 101, and the gas-phase zone module 102 is arranged above the liquid-phase zone module 101. The pump drive device liquid inlet 3, the pump drive device liquid outlet 4, the liquid supply port 5, and the exhaust port 6 are arranged on the box body 1 and are located outside the liquid-phase zone module 101. The drive pump 2 is connected to the pump drive device liquid outlet 4 through the high-pressure delivery pipe or the high-pressure chamber 21. The gas-phase zone module 102 is provided with at least one interface.

Embodiment 3

A pump drive device is provided in this embodiment, including the box body 1 and at least one drive pump 2. The liquid-phase zone module 101 and the gas-phase zone module 102 are arranged in the box body 1. The drive pump 2 is arranged in the liquid-phase zone module 101, and the gas-phase zone module 102 is arranged above the liquid-phase zone module 101. The pump drive device liquid inlet 3, the pump drive device liquid outlet 4, the liquid supply port 5, and the exhaust port 6 are arranged on the box body 1 and are located outside the liquid-phase zone module 101. The drive pump 2 is connected to the pump drive device liquid outlet 4 through the high-pressure delivery pipe or the high-pressure chamber 21. The gas-phase zone module 102 is provided with at least one interface.

The air supply valve 7 is provided at the interface of the gas-phase zone module 102.

In this embodiment, the pump drive device further includes the medium purification module assembly 8. The medium purification module assembly 8 is arranged between the pump drive device liquid inlet 3 and the pump drive device liquid outlet 4. The medium purification module assembly 8 and the pump drive device are connected in parallel. A part of a cooling medium enters the medium purification module assembly 8 to reduce an electrical conductivity of the cooling medium and maintain the purity of the cooling medium. A tank for storing the medium is arranged in the medium purification module assembly 8, and the tank is provided with a medium for removing anions, cations, organic matters, colloids, peculiar smell, residual chlorine and other impurities in water. The medium is a mixed bed resin and a porous adsorption medium.

Embodiment 4

A pump drive device as shown in FIGS. 1A, 2, 3, 4, 5A, 6 and 7 is provided in this embodiment, including the box body 1 and at least one drive pump 2. The liquid-phase zone module 101 and the gas-phase zone module 102 are arranged in the box body 1. The drive pump 2 is arranged in the liquid-phase zone module 101, and the gas-phase zone module 102 is arranged above the liquid-phase zone module 101. The pump drive device liquid inlet 3, the pump drive device liquid outlet 4, the liquid supply port 5, and the exhaust port 6 are arranged on the box body 1 and are located outside the liquid-phase zone module 101. The drive pump 2 is connected to the pump drive device liquid outlet 4 through the high-pressure delivery pipe or the high-pressure chamber 21. The gas-phase zone module 102 is provided with at least one interface-air supply valve 7. The liquid supply port 5 is welded adjacent to the pump drive device liquid outlet 4. The exhaust port 6 is configured to, through a small pipe, guide and exhaust the gas in a cooling medium to the atmosphere. The cooling medium enters the submerged pump drive device through the liquid supply port 5, and when the system is running, the cooling medium enters through the pump drive device liquid inlet 3 and flows out through the pump drive device liquid outlet 4.

In this embodiment, the pump drive device liquid inlet 3 is connected to the box body 1 through the liquid inlet pipe 31. The liquid return temperature transmitter 32 and the liquid return pressure transmitter 33 are arranged on the liquid inlet pipe 31, and the liquid return temperature transmitter 32 and the liquid return pressure transmitter 33 are connected to a control device.

In this embodiment, the pump drive device liquid outlet 4 is connected to the box body 1 through the liquid outlet pipe 41. The liquid supply temperature transmitter 42 and the liquid supply pressure transmitter 43 are arranged at the top of the box body 1 and are located directly above the liquid outlet pipe 41, and the liquid supply temperature transmitter 42 and the liquid supply pressure transmitter 43 are connected to the control device.

In this embodiment, the box body 1 is provided with the liquid-level switch 9 and the liquid-level meter 10. The liquid-level switch 9 is arranged at a low liquid level of the box body, and the liquid-level switch 9 and the liquid-level meter 10 are connected to the control device. When a liquid level in a liquid-phase zone of the submerged pump drive device is excessively low, a warning signal is automatically sent out and the warning signal needs to be read by an external control system.

In this embodiment, the check valve or the one-way valve 201 is arranged inside the pump to avoid the formation of a water hammer to cause damage to the liquid cooling system, and to prevent the cooling medium from flowing backward, or returning to an inlet of a working pump through a reserve pump to cause a short circuit.

In this embodiment, the pump drive device liquid inlet 3 or the pump drive device liquid outlet 4 is provided with the filter assembly 11. One end of the filter assembly 11 is connected to a pipe at the pump drive device liquid inlet 3 or the pump drive device liquid outlet 4 through the clamp 113, and the other end of the filter assembly 11 is welded and fixed to the pipe at the pump drive device liquid inlet 3 or the pump drive device liquid outlet 4. The filter assembly 11 is provided with the housing 111 and the filter cartridge 112, and the filter cartridge 112 is arranged in the housing 111.

Embodiment 5

A pump drive device as shown in FIGS. 1B, 2, 3, 4, 5B, 6 and 8 is provided in this embodiment, including the box body 1 and at least one drive pump 2. The liquid-phase zone module 101 and the gas-phase zone module 102 are arranged in the box body 1. The drive pump 2 is arranged in the liquid-phase zone module 101, and the gas-phase zone module 102 is arranged above the liquid-phase zone module 101. The pump drive device liquid inlet 3, the pump drive device liquid outlet 4, the liquid supply port 5, and the exhaust port 6 are arranged on the box body 1 and are located outside the liquid-phase zone module 101. The drive pump 2 is connected to the pump drive device liquid outlet 4 through the high-pressure delivery pipe or the high-pressure chamber 21. The gas-phase zone module 102 is provided with at least one interface-air supply valve 7. The liquid supply port 5 is welded adjacent to the pump drive device liquid outlet 4. The exhaust port 6 is configured to, through a small pipe, guide and exhaust the gas in a cooling medium to the atmosphere. The cooling medium enters the submerged pump drive device through the liquid supply port 5, and when the system is running, the cooling medium enters through the pump drive device liquid inlet 3 and flows out through the pump drive device liquid outlet 4.

In this embodiment, the pump drive device liquid inlet 3 is connected to the box body 1 through the liquid inlet pipe 31. The liquid return temperature transmitter 32 and the liquid return pressure transmitter 33 are arranged on the liquid inlet pipe 31, and the liquid return temperature transmitter 32 and the liquid return pressure transmitter 33 are connected to a control device.

In this embodiment, the pump drive device liquid outlet 4 is connected to the box body 1 through the liquid outlet pipe 41. The liquid supply temperature transmitter 42 and the liquid supply pressure transmitter 43 are arranged at the top of the box body 1 and are located directly above the liquid outlet pipe 41, and the liquid supply temperature transmitter 42 and the liquid supply pressure transmitter 43 are connected to the control device.

In this embodiment, the box body 1 is provided with the liquid-level switch 9 and the liquid-level meter 10. The liquid-level switch 9 is arranged at a low liquid level of the box body, and the liquid-level switch 9 and the liquid-level meter 10 are connected to the control device. When a liquid level in a liquid-phase zone of the submerged pump drive device is excessively low, a warning signal is automatically sent out and the warning signal needs to be read by an external control system.

In this embodiment, the check valve or the one-way valve 201 is arranged outside the pump to avoid the formation of a water hammer to cause damage to the liquid cooling system, and to prevent the cooling medium from flowing backward, or returning to an inlet of a working pump through a reserve pump to cause a short circuit.

In this embodiment, the pump drive device liquid inlet 3 or the pump drive device liquid outlet 4 is provided with the filter assembly 11. One end of the filter assembly 11 is connected to a pipe at the pump drive device liquid inlet 3 or the pump drive device liquid outlet 4 through the clamp 113, and the other end of the filter assembly 11 is welded and fixed to the pipe at the pump drive device liquid inlet 3 or the pump drive device liquid outlet 4. The filter assembly 11 is provided with the housing 111 and the filter cartridge 112, and the filter cartridge 112 is arranged in the housing 111.

Embodiment 6

Figure 5A:
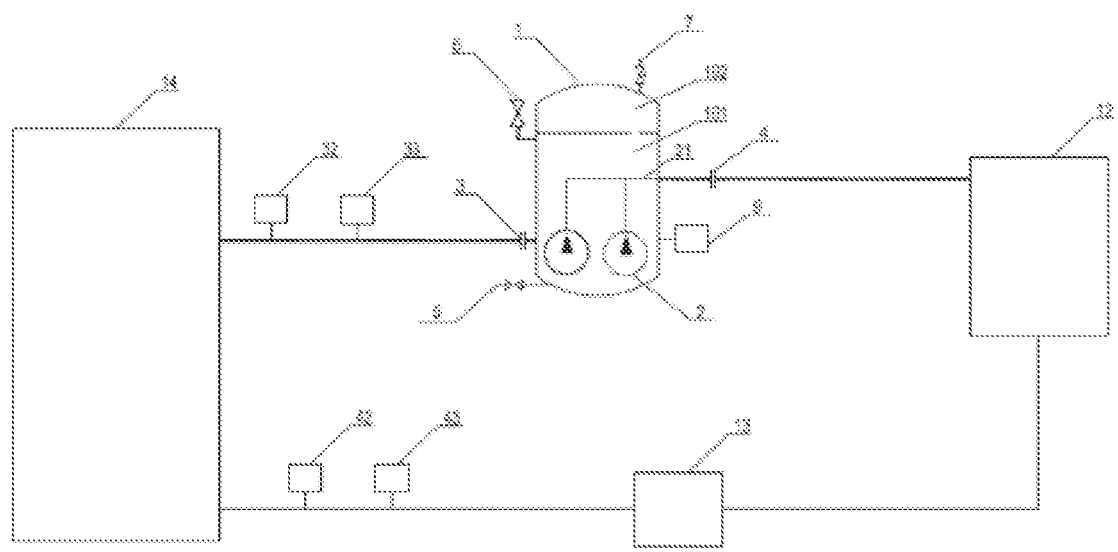
FIG. 5A is a flow chart illustrating the connection between a liquid cooling system provided with a check valve inside a pump and a heating component according to the present invention.
Figure 5B:
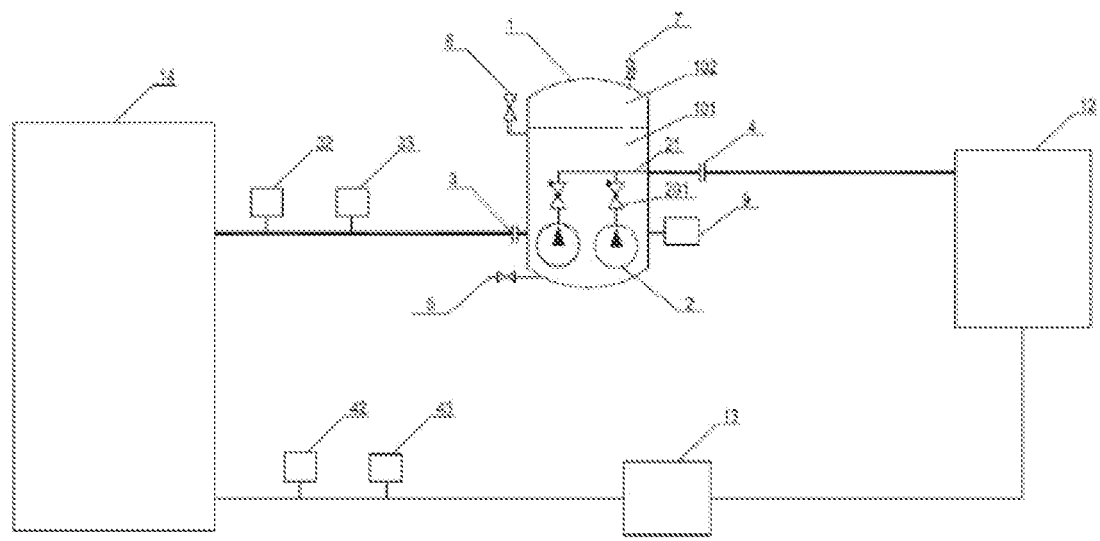
FIG. 5B is a flow chart illustrating the connection between a liquid cooling system provided with a check valve outside a pump and a heating component according to the present invention.
Figure 6:
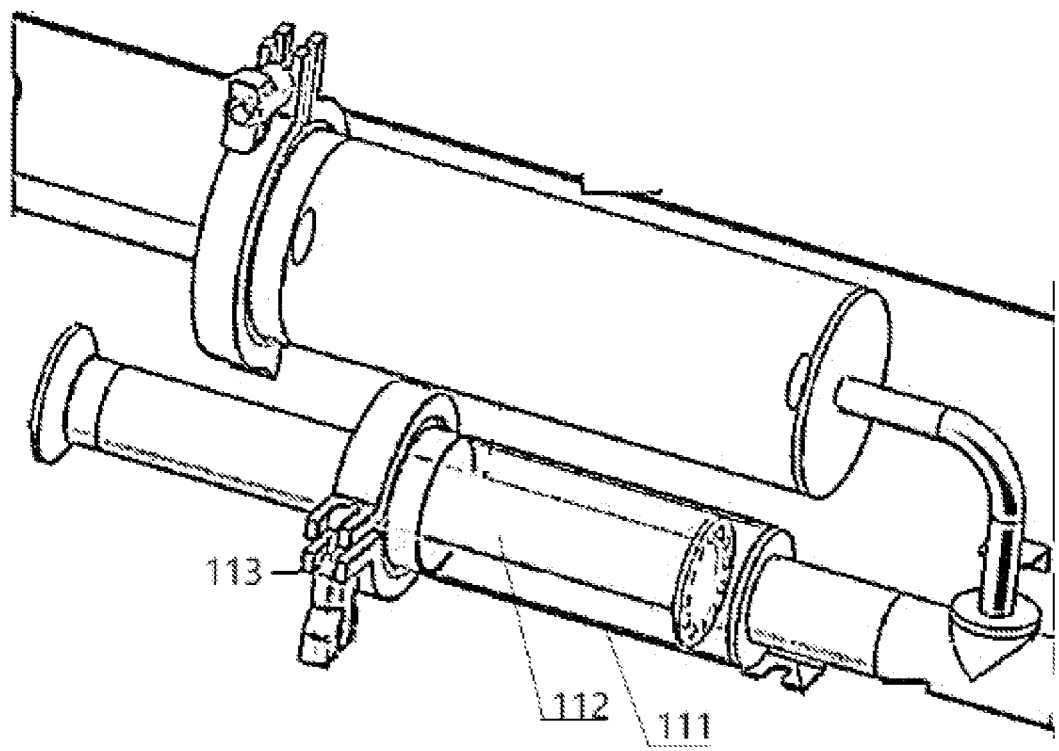
FIG. 6 is a structural diagram illustrating the arrangement of the filter assembly according to the present invention.
Figure 7:
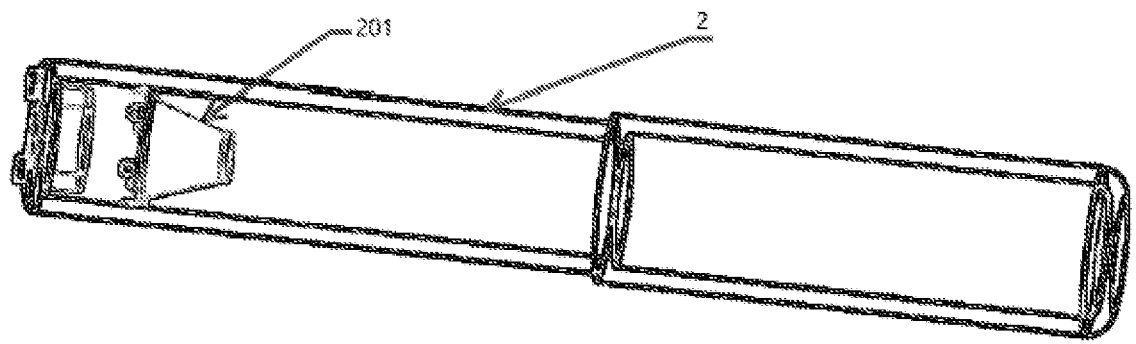
FIG. 7 is a structural diagram of the check valve inside the drive pump according to the present invention.
Figure 8:
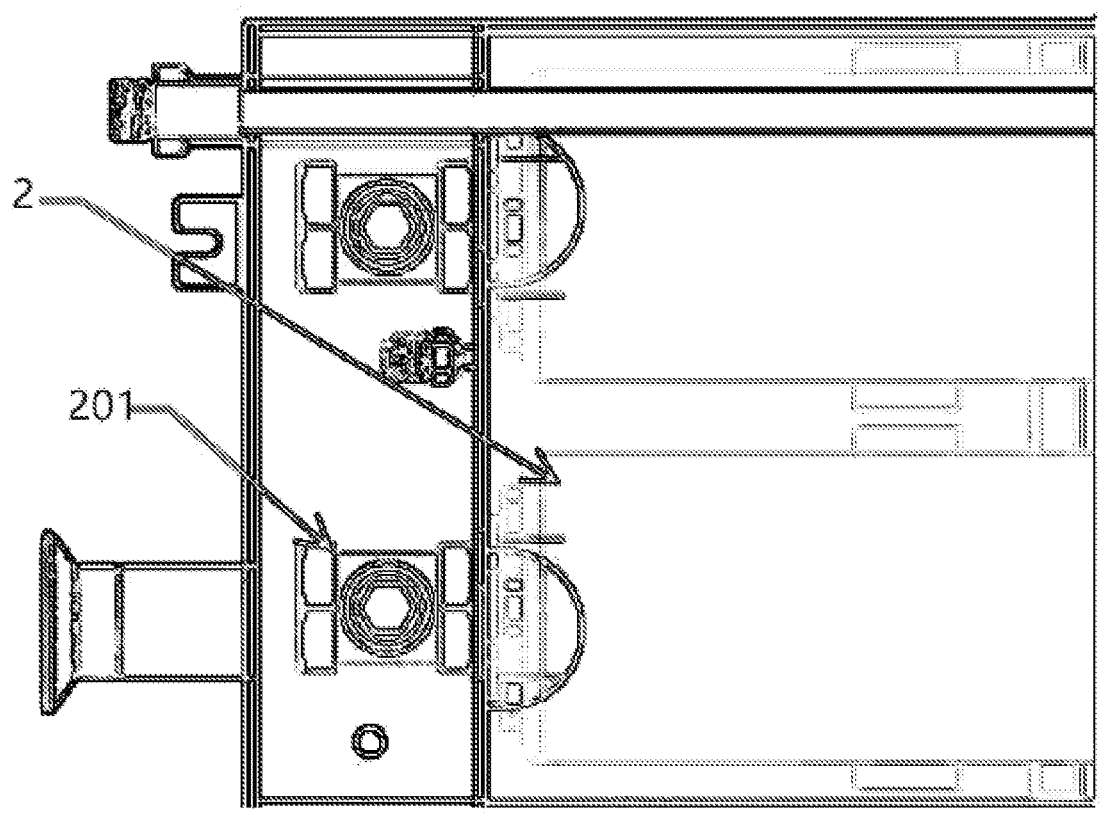
FIG. 8 is a structural diagram of the check valve outside the drive pump according to the present invention.

FIGS. 1-4 show a pump drive device, and FIG. 5A or FIG. 5B shows a connection between a liquid cooling system and a heating component. The liquid cooling system includes a pump drive device, the condenser 12, and the second filter assembly 13. FIG. 7 is a structural diagram of the check valve inside the drive pump. FIG. 8 is a structural diagram of the check valve outside the drive pump.

The pump drive device is a submerged pump drive device, which may be a horizontal submerged pump drive device or a vertical submerged pump drive device. The pump drive device is provided with the box body 1 and at least one drive pump 2. The pump drive device liquid outlet 4 of the box body 1 is connected to an inlet of the condenser 12 through a pipe. A hot-side outlet of the condenser 12 is connected to an inlet end of the second filter assembly 13 through a pipe. An outlet end of the second filter assembly 13 is connected to a liquid supply port of the heating component 14 through a pipe. A liquid return port of the heating component 14 is connected to the pump drive device liquid inlet 3 through a pipe.

The submerged pump drive device is manufactured from materials having good compatibility with the cooling medium, which meet the compatibility requirements such as corrosion resistance and organic matter compatibility. The submerged pump drive device has good seal, and has no leakage at welding joints between pipes and the tank body after being subjected to a strict hydraulic test.

The liquid-phase zone module 101 and the gas-phase zone module 102 are arranged in the box body 1. The drive pump 2 is arranged in the liquid-phase zone module 101, and the gas-phase zone module 102 is arranged above the liquid-phase zone module 101. The pump drive device liquid inlet 3, the pump drive device liquid outlet 4, the liquid supply port 5, and the exhaust port 6 are arranged on the box body 1 and are located outside the liquid-phase zone module 101. The drive pump 2 is connected to the pump drive device liquid outlet 4 through the high-pressure delivery pipe or the high-pressure chamber 21. The interface of the drive pump 2 employs a flange, a thread, a clamp, or other connection manners. An outlet of the drive pump 2 is connected to the high-pressure delivery pipe or the high-pressure chamber 21 through a connector, and the high-pressure delivery pipe or the high-pressure chamber 21 is connected to the pump drive device liquid outlet 4 of the submerged pump drive device. The gas-phase zone module 102 is provided with at least one interface-air supply valve 7.

In this embodiment, the pump drive device further includes the medium purification module assembly 8. The medium purification module assembly 8 is arranged between the pump drive device liquid inlet 3 and the pump drive device liquid outlet 4. The medium purification module assembly 8 and the pump drive device are connected in parallel. A part of a cooling medium enters the medium purification module assembly 8 to reduce an electrical conductivity of the cooling medium and maintain the purity of the cooling medium. A tank for storing the medium is arranged in the medium purification module assembly 8, and the tank is provided with a medium for removing anions, cations, organic matters, colloids, peculiar smell, residual chlorine and other impurities in water. The medium is a mixed bed resin and a porous adsorption medium.

In this embodiment, the pump drive device liquid inlet 3 is connected to the box body 1 through the liquid inlet pipe 31. The liquid return temperature transmitter 32 and the liquid return pressure transmitter 33 are arranged on the liquid inlet pipe 31, and the liquid return temperature transmitter 32 and the liquid return pressure transmitter 33 are connected to a control device.

In this embodiment, the pump drive device liquid outlet 4 is connected to the box body 1 through the liquid outlet pipe 41. The liquid supply temperature transmitter 42 and the liquid supply pressure transmitter 43 are arranged at the top of the box body 1 and are located directly above the liquid outlet pipe 41, and the liquid supply temperature transmitter 42 and the liquid supply pressure transmitter 43 are connected to the control device.

In this embodiment, the box body 1 is provided with the liquid-level switch 9 and the liquid-level meter 10. The liquid-level switch 9 is arranged at a low liquid level of the box body, and the liquid-level switch 9 and the liquid-level meter 10 are connected to the control device. When a liquid level in a liquid-phase zone of the submerged pump drive device is excessively low, a warning signal is automatically sent out and the warning signal needs to be read by an external control system.

In this embodiment, the check valve or the one-way valve 201 is arranged inside or outside the pump to avoid the formation of a water hammer to cause damage to the system, and to prevent the cooling medium from flowing backward, or returning to an inlet of a working pump through a reserve pump to cause a short circuit.

In this embodiment, the pump drive device liquid inlet 3 or the pump drive device liquid outlet 4 is provided with the filter assembly 11.

The filter assembly 11 is provided with a housing and a filter cartridge, and the filter cartridge is arranged in the housing. The housing is welded and fixed to the pump drive device liquid inlet 3 or the pump drive device liquid outlet 4.

A working method of the pump drive device in this embodiment is specifically as follows:

1) a liquid supply trolley is connected to the liquid supply port 5 through a quick connector; the liquid supply port 5 and the exhaust port 6 are opened, and a water supply pump of the liquid supply trolley is turned on to supply water to a liquid cooling system; after the continuous water flow is discharged through the exhaust port 6, the exhaust port 6 is closed; and the supply of water is continued, and when the control device shows that a static pressure reaches a set value, the supply of water is stopped; where the liquid return pressure transmitter 33 reflects the static pressure of the system;

2) the condenser is prepared to enter a working state, where the condenser is a plate heat exchanger or an air-cooled radiator; when the condenser is the plate heat exchanger, a cold side of the plate heat exchanger is previously supplied with a cooling medium, and a flow rate of the cooling medium is adjusted to a set flow rate; and when the condenser is the air-cooled radiator, it is checked whether wire connections of fans are accurate;

3) the drive pump 2 is turned on by the control device to allow the cooling medium to circulate in the liquid cooling system, where the cooling medium absorbs heat of the heating component 14 and is changed from liquid to steam, the steam enters through the pump drive device liquid inlet 3 and flows out through the pump drive device liquid outlet 4 to enter the condenser 12, then the steam is condensed into the liquid, and the liquid is filtered through a second filter assembly to remove impurities and then enters the heating component 14 to complete a cycle;

4) when the condenser is the air-cooled radiator, the fans are connected to the control device, and the fans are turned on after the pump is turned on, where the starting number and a rotational speed of the fans are controlled according to a liquid supply temperature; and 5) during a normal operation of the liquid cooling system, the liquid supply temperature transmitter and the liquid supply pressure transmitter monitor the liquid supply temperature and a liquid supply pressure, respectively, and the control device can read values of the liquid supply temperature and the liquid supply pressure; and the liquid return temperature transmitter and the liquid return pressure transmitter monitor a liquid return temperature and a liquid return pressure, respectively, and the control device can read values of the liquid return temperature and the liquid return pressure.

The above merely shows preferred embodiments of the present invention. It should be noted that those skilled in the art may further make several improvements without departing from the principle of the present invention, but such improvements shall fall within the scope of protection of the present invention.

What is claimed is:

1. A pump drive device, comprising:
    a box body and a drive pump, wherein a liquid-phase zone module is arranged in the box body, and the drive pump is arranged in the liquid-phase zone module;
    a pump drive device liquid inlet, a pump drive device liquid outlet, a liquid supply port, and an exhaust port are arranged on an outside of the box body and are thereby located outside the liquid-phase zone module; and
    wherein the drive pump is connected to the pump drive device liquid outlet through a high-pressure delivery pipe or a high-pressure chamber, and
    wherein the pump drive device liquid inlet is connected to the box body through a liquid inlet pipe; a liquid return temperature transmitter and a liquid return pressure transmitter are arranged on the liquid inlet pipe, and the liquid return temperature transmitter and the liquid return pressure transmitter are connected to a control device.

2. The pump drive device according to claim 1, wherein a gas-phase zone module is arranged in the box body, the gas-phase zone module is arranged above the liquid-phase zone module, and the gas-phase zone module is provided with at least one interface.

3. The pump drive device according to claim 2, wherein an air supply valve is provided at the least one interface of the gas-phase zone module.

4. The pump drive device according to claim 1, further comprising a medium purification module assembly, wherein the medium purification module assembly is arranged between the pump drive device liquid inlet and the pump drive device liquid outlet.

5. The pump drive device according to claim 1, wherein the pump drive device liquid outlet is connected to the box body through a liquid outlet pipe; a liquid supply temperature transmitter and a liquid supply pressure transmitter are arranged at a top of the box body and are located directly above the liquid outlet pipe, and the liquid supply temperature transmitter and the liquid supply pressure transmitter are connected to the control device.

6. The pump drive device according to claim 1, wherein the box body is provided with a liquid-level switch and a liquid-level meter, and the liquid-level switch and the liquid-level meter are connected to a control device.

7. The pump drive device according to claim 1, wherein a check valve or a one-way valve is arranged inside or outside the drive pump.

8. The pump drive device according to claim 1, wherein the pump drive device liquid inlet or the pump drive device liquid outlet is provided with a filter assembly.

9. A working method of a pump drive device comprising a box body and a drive pump, wherein a liquid-phase zone module is arranged in the box body, and the drive pump is arranged in the liquid-phase zone module; a pump drive device liquid inlet, a pump drive device liquid outlet, a liquid supply port, and an exhaust port are arranged on an outside of the box body and are thereby located outside the liquid-phase zone module; and wherein the drive pump is connected to the pump drive device liquid outlet through a high-pressure delivery pipe or a high-pressure chamber, the working method comprising:
    step (1): connecting a liquid supply trolley to the liquid supply port through a quick connector; opening the liquid supply port and the exhaust port, and turning on a water supply pump of the liquid supply trolley to supply water to a liquid cooling system; after a continuous water flow is discharged through the exhaust port, closing the exhaust port; and continuing to supply water, and when a control device shows that a static pressure reaches a set value, stopping supplying water; wherein a liquid return pressure transmitter reflects the static pressure of the liquid cooling system;
    step (2): preparing a condenser to enter a working state, wherein the condenser is a plate heat exchanger or an air-cooled radiator; when the condenser is the plate heat exchanger, previously supplying a cold side of the plate heat exchanger with a cooling medium, and adjusting a flow rate of the cooling medium to a set flow rate; and when the condenser is the air-cooled radiator, checking whether wire connections of fans are accurate;
    step (3): turning on the drive pump by the control device to allow the cooling medium to circulate in the liquid cooling system, wherein the cooling medium absorbs heat of a heating component and is changed from liquid to steam, the steam enters through the pump drive device liquid inlet and flows out through the pump drive device liquid outlet to enter the condenser, then the steam is condensed into the liquid, and the liquid is filtered through a first filter assembly to remove impurities and then enters the heating component to complete a cycle;
    step (4): when the condenser is the air-cooled radiator, connecting the fans to the control device, and turning on the fans after the drive pump is turned on, wherein a starting number and a rotational speed of the fans are controlled according to a liquid supply temperature; and
    step (5): during a normal operation of the liquid cooling system, monitoring the liquid supply temperature and a liquid supply pressure by a liquid supply temperature transmitter and a liquid supply pressure transmitter, respectively, and reading values of the liquid supply temperature and the liquid supply pressure by the control device; and monitoring a liquid return temperature and a liquid return pressure by a liquid return temperature transmitter and the liquid return pressure transmitter, respectively, and reading values of the liquid return temperature and the liquid return pressure by the control device.

10. The working method according to claim 9, wherein a gas-phase zone module is arranged in the box body, the gas-phase zone module is arranged above the liquid-phase zone module, and the gas-phase zone module is provided with at least one interface.

11. The working method according to claim 10, wherein an air supply valve is provided at the least one interface of the gas-phase zone module.

12. The working method according to claim 9, wherein the pump drive device further comprises a medium purification module assembly, and the medium purification module assembly is arranged between the pump drive device liquid inlet and the pump drive device liquid outlet.

13. The working method according to claim 9, wherein the pump drive device liquid inlet is connected to the box body through a liquid inlet pipe; the liquid return temperature transmitter and the liquid return pressure transmitter are arranged on the liquid inlet pipe, and the liquid return temperature transmitter and the liquid return pressure transmitter are connected to the control device.

14. The working method according to claim 9, wherein the pump drive device liquid outlet is connected to the box body through a liquid outlet pipe; the liquid supply temperature transmitter and the liquid supply pressure transmitter are arranged at a top of the box body and are located directly above the liquid outlet pipe, and the liquid supply temperature transmitter and the liquid supply pressure transmitter are connected to the control device.

15. The working method according to claim 9, wherein the box body is provided with a liquid-level switch and a liquid-level meter, and the liquid-level switch and the liquid-level meter are connected to the control device.

16. The working method according to claim 9, wherein a check valve or a one-way valve is arranged inside or outside the drive pump.

17. The working method according to claim 9, wherein the pump drive device liquid inlet or the pump drive device liquid outlet is provided with a second filter assembly.

18. A pump drive device, comprising:
   a box body and a drive pump, wherein a liquid-phase zone module is arranged in the box body, and the drive pump is arranged in the liquid-phase zone module;
   a pump drive device liquid inlet, a pump drive device liquid outlet, a liquid supply port, and an exhaust port are arranged on an outside of the box body and are thereby located outside the liquid-phase zone module; and
   wherein the drive pump is connected to the pump drive device liquid outlet through a high-pressure delivery pipe or a high-pressure chamber, and
   wherein the pump drive device liquid outlet is connected to the box body through a liquid outlet pipe; a liquid supply temperature transmitter and a liquid supply pressure transmitter are arranged at a top of the box body and are located directly above the liquid outlet pipe, and the liquid supply temperature transmitter and the liquid supply pressure transmitter are connected to a control device.

19. The pump drive device according to claim 18, wherein a gas-phase zone module is arranged in the box body, the gas-phase zone module is arranged above the liquid-phase zone module, and the gas-phase zone module is provided with at least one interface.

20. The pump drive device according to claim 19, wherein an air supply valve is provided at the least one interface of the gas-phase zone module.

\* \* \* \* \*